United States Patent

Hallatt et al.

[11] Patent Number: 6,064,276
[45] Date of Patent: May 16, 2000

[54] OSCILLATOR CIRCUIT

[75] Inventors: John G. Hallatt; Ian R. Aldred, both of Herts, United Kingdom

[73] Assignee: Microware Solutions Limited, Herts, United Kingdom

[21] Appl. No.: 09/098,267

[22] Filed: Jun. 16, 1998

[51] Int. Cl.[7] ...................................................... H03B 5/18
[52] U.S. Cl. ............................ 331/96; 331/99; 331/117 D
[58] Field of Search ............................ 331/96, 99, 117 D, 331/107 SL, 117 FE, 177 V; 332/130, 136

[56] References Cited

U.S. PATENT DOCUMENTS

| | | | |
|---|---|---|---|
| 4,481,487 | 11/1984 | Brehm et al. | 331/117 |
| 4,737,737 | 4/1988 | Khanna | 331/47 |
| 5,079,524 | 1/1992 | Sugawara | 331/96 |
| 5,289,139 | 2/1994 | Fiedziuszko et al. | 331/56 |

FOREIGN PATENT DOCUMENTS

0475262A1  3/1992  European Pat. Off. .

OTHER PUBLICATIONS

Stanley Burns and Paul Bond, Principles of Electronic Circuits, 2nd paragraph in p. 67, 1987.

*Primary Examiner*—Robert Pascal
*Assistant Examiner*—Henry Choe
*Attorney, Agent, or Firm*—Sheldon & Mark; Jeffrey G. Sheldon

[57] ABSTRACT

An oscillator circuit comprising first and second mutually electromagnetically couplable resonant circuits, the second circuit comprising a dielectric element and excitation means operable to produce a first frequency of oscillation, the first circuit comprising the dielectric element, excitation means including a two-terminal Schottky device, preferably a Schottky diode, operable, responsive to an applied signal, to vary the resonant frequency of the first resonant circuit, and thereby vary the frequency of oscillation of the oscillator circuit.

8 Claims, 6 Drawing Sheets

OSCILLATOR CIRCUIT

The present invention relates to an oscillator circuit, and more particularly to a tunable microwave oscillator and to motion detectors which utilise such oscillators.

Typically, an electronically tunable microwave oscillator can utilise a reverse biased varactor having a capacitance which varies according to a corresponding variation in an applied reverse modulation voltage. In order to effect a change in varactor capacitance, and hence to utilise the varactor as a practical frequency tuning device, a modulating signal of high magnitude is required. Typically, at a frequency of oscillation of about 10 GHz, a variation of 30V in the applied reverse modulating voltage brings about a corresponding variation of about 20 MHz in the frequency of oscillation of a tunable microwave oscillator utilising such a varactor. The frequency range over which the frequency of oscillation of a tunable microwave varactor oscillator can be varied is governed, in part, by the degree of capacitance change of the varactor over the range over which the modulating voltage is varied. A varactor oscillator is illustrated and described in "Dielectric Resonators" published by Artech House and in GB2307355A. The relationship between the degree of frequency modulation and applied modulating signal is only linear for varactors over a narrow percentage bandwidth of up to 3%. Further, relatively large reverse biasing voltages are required for varactor oscillators in order to realise sufficient Q to establish and sustain oscillation. A typical biasing voltage is of the order of 20v to 30v. At these voltages the tuning range available is very limited. The above renders the use of varactors undesirable for low noise oscillators.

It is an object of the present invention to at least mitigate some of the problems associated with prior art tunable microwave oscillators, preferably, for use in motion detectors.

Accordingly, the present invention provides an oscillator circuit comprising first and second mutually electromagnetically couplable resonant circuits, the second resonant circuit comprising a dielectric element and excitation means operable to produce a first frequency of oscillation, the first resonant circuit comprising the dielectric element and excitation means, including a forward biased two terminal device, operable responsive to an applied signal, to vary the resonant frequency of the first resonant circuit and thereby vary the frequency of oscillating of the oscillator circuit.

Advantageously, an embodiment of the present invention is provided wherein the forward biased two terminal device comprises a Schottky junction. Suitably, an embodiment is provided wherein the two terminal device is a Schottky device, for example, a Schottky diode.

Operating the Schottky diode in forward bias mode produces a relatively large variation in frequency in response to a relative small variation in modulating voltage. Furthermore, the voltages required to operate a Schottky based oscillator are significantly less than those required to operate a varactor based oscillator.

Preferably, an embodiment of the present invention provides an oscillator circuit wherein the modes of resonance have associated coupling points on the excitation means and the excitation means is arranged such that the coupling points are a substantially equal distance from the dielectric element.

A further embodiment of the invention provides an oscillator circuit wherein the dielectric element comprises an arcuate profile and said excitation means is arranged to follow substantially the arcuate profile of the dielectric element.

Preferably, the excitation means comprises excitation strip lines or microstrip lines.

Embodiments of the present invention will now be described, by way of example only, with reference to the accompanying drawings in which.

The use of the doppler effect for detecting motion is well known within the art. For example, in microwave intruder detection devices it is known to provide a dielectric resonator oscillator and diode mixer, mounted in a cavity, which are arranged to provide an output or transmit signal at a required frequency and an input or receive signal, together with a doppler IF output.

Figure 1:
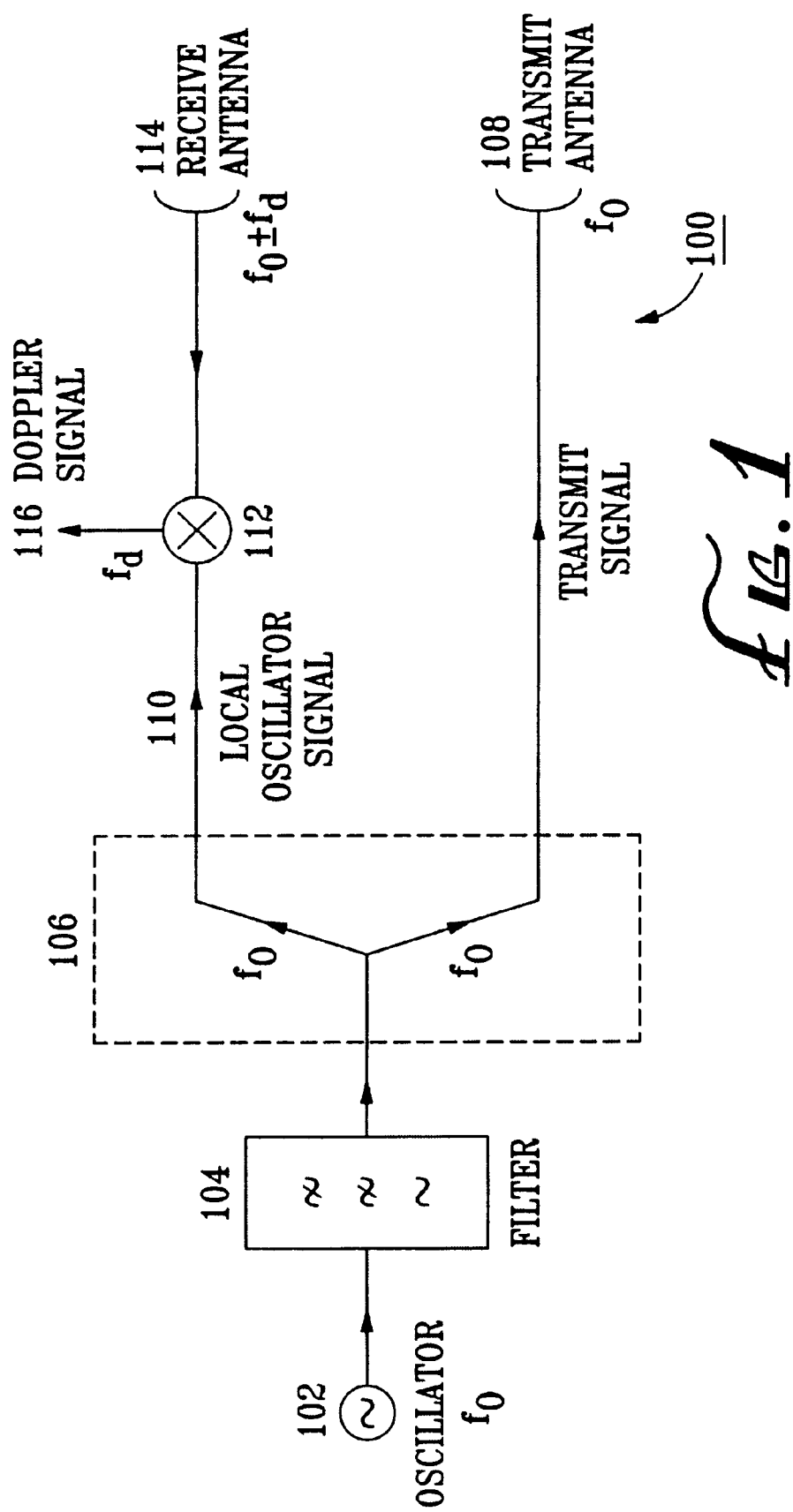
FIG. 1 illustrates schematically a typical transmit-receive arrangement of a motion detector.

Referring to FIG. 1, there is shown schematically a microwave circuit 100 having oscillator 102 producing an output frequency $f_0$ connected to a filter 104 arranged to pass the fundamental frequency of the oscillator, $f_0$, and to block the second and higher order harmonics thereof. The output from the filter 104 is fed to a local oscillator signal. A transmit antenna 108 is used to radiate the transmit signal. The local oscillator signal 110 is fed to a mixer 112. The mixer 112 has an input from the receive antenna 114 arranged to receive the reflected signal. As is well appreciated within the art if the received signal was reflected from a moving object, it will be a doppler shifted version of the transmit signal. The mixer 112 combines the local oscillator signal with the received signal received by the receive antenna 114. The output 116 from the mixer 112 contains the Doppler frequency produced by the reflection of the transmit signal of frequency $f_0$ from a moving body (not shown). The presence or absence of the doppler signal at the output 116 determines whether or not a moving object has been detected.

Figure 2:
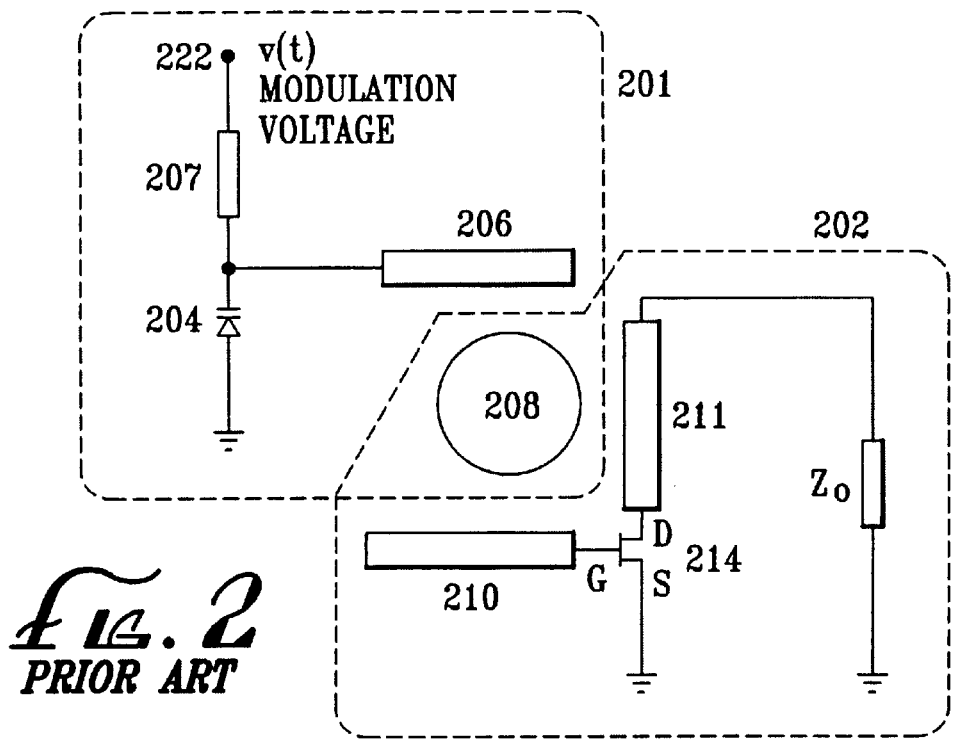
FIG. 2 shows schematically a prior art oscillator for a motion detection device.

Referring to FIG. 2, there is shown schematically a prior art embodiment for a motion detector circuit having an oscillator 102 comprising first 201 and second 202 mutually coupled resonant circuits. The first resonant circuit 201 of the oscillator 102 arrangement shown in FIG. 2 is a varactor 204 in conjunction with a microstrip line 206 arranged to resonate close to the frequency of operation of a dielectric resonator 208.

The second resonator circuit 202 comprises the dielectric resonator 208 electromagnetically coupled, in use, to a further microstrip line 210 connected to the gate of field effect transistor 214 and a microstrip line 211 connected to the drain of field effect transistor 214 and which forms part of the feedback loop of the oscillator. The FET 214 utilises various impedances which are arranged to correctly match the FET 214.

By varying or modulating the varactor capacitance with an applied voltage 222, the resonant frequency of resonant circuit 201, can be tuned resulting in a change of oscillation frequency of the resonant circuit 202.

It will be appreciated by one skilled in the art that the closer the electromagnetic coupling between the dielectric resonator and the microstrip lines, the greater the resultant frequency control. This increased frequency control is at the expense of decreased oscillator Q factor.

Figure 3:
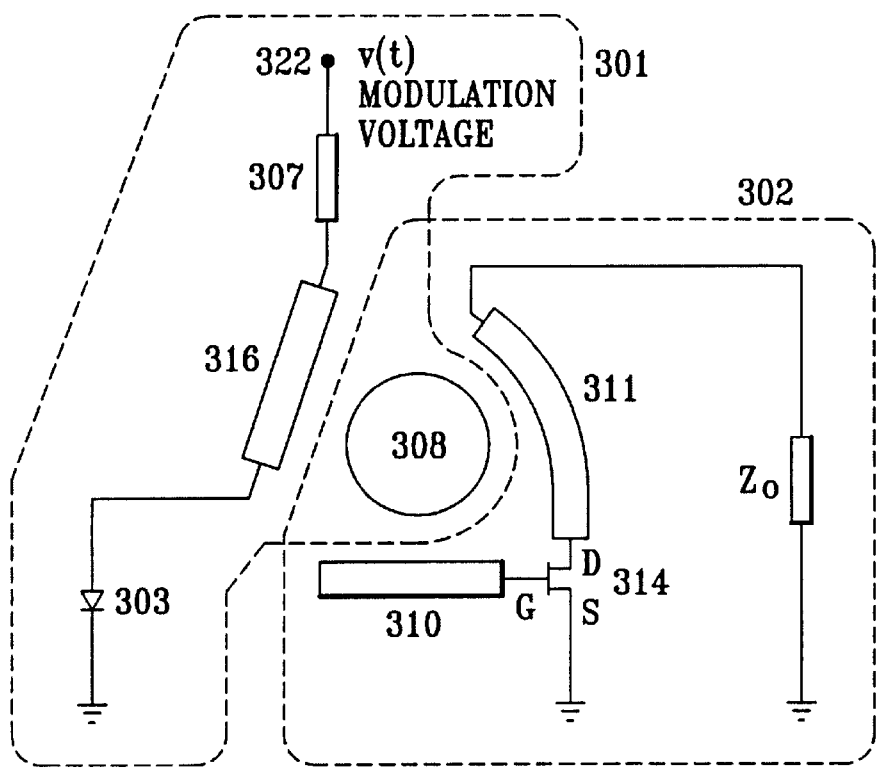
FIG. 3 depicts schematically an oscillator for a motion detection device according to an embodiment.

With reference to FIG. 3, there is shown an oscillator circuit for a microwave detector according to an embodiment of the present invention. The oscillator 300 comprises first 301 and second 302 mutually coupled resonant circuits.

The first resonant tuning circuit 301 consists of a microstrip line 316 which has a Schottky diode 303 connected at one end, and a modulation voltage 322, v(t), applied via resistor 307, to the other end of said microstrip line. The tuning line 316 is situated adjacent to a dielectric element, preferably, for example, a dielectric resonator 308 so that, in use, the dielectric resonator 308 and the tuning line 316 are electromagnetically coupled.

Electronic frequency tuning of the oscillator 300 is achieved by varying the modulation voltage 322, which causes the junction capacitance of the Schottky diode 303 to vary. The change in capacitance brings about a change in the effective length of the tuning line 316 thereby altering the resonant frequency of the tuning line 316. Since the first resonant tuning circuit 301 is mutually coupled to the second resonant circuit 302 via the dielectric resonator 308, the oscillation frequency of the oscillator 300 also varies according to the variation of the modulation voltage 322.

Preferably, the Schottky diode is a BAT15-03W available from Siemens operable at a diode voltage of close to 0V. Under such operating conditions the variation in capacitance is as shown in table 1 below.

TABLE 1

| $V_F/V$ | C/fF |
|---|---|
| −0.05 | 241 |
| 0.00 | 245 |
| +0.05 | 252 |

It will be appreciated that an increase in forward voltage from 0V to 0.05V brings about a 2.9% increase in capacitance.

In the present oscillator embodiment a DC voltage is applied to the Schottky diode 303 (connected in forward bias) via resistor 307. Typically, the frequency of the oscillator 300 is shifted by −12 MHz from a nominal frequency of 10.525 GHz, at an applied tuning voltage 322 of +5V. The frequency shift may be changed by altering the coupling to the dielectric resonator 308.

For comparison, a typical prior art varactor-tuned oscillator operating at a frequency of 10 GHz requires a variation of up to 30V in the modulating voltage in order to produce a frequency shift of 20 MHz.

The Schottky diode 303 is operated in forward bias mode. This is in contrast to the varactor 204 of FIG. 2 which is operated in reverse bias. The higher degree of change in junction capacitance of the Schottky diode 303 at small forward voltages is capitalised on, resulting in a relatively large change in effective length of tuning line 316, and hence large frequency shift of the oscillator 300. The complete tunable oscillator 300 may thus be operated with voltages which are of significantly smaller magnitude as compared to the voltages used in conventional varactor-tuned oscillator 102. A significant reduction in component and circuit cost thus results.

Although FIG. 3 shows the use of a single Schottky diode, the present invention is not limited thereto. It will be appreciated by one skilled in the art that diodes or diode pairs could equally well be utilised to realise an embodiment of the present invention. Furthermore, embodiments can also be realised in which the microstrip lines are arcuate as opposed to being straight. Still further, it will be appreciated that the position of the circuit elements depicted in FIG. 3 et seq are not fixed and can be suitably repositioned without departing from the scope of the present invention. It will also be appreciated by one skilled in the art that there are many other possible oscillator topologies which can be realised using the present invention.

Figure 4:
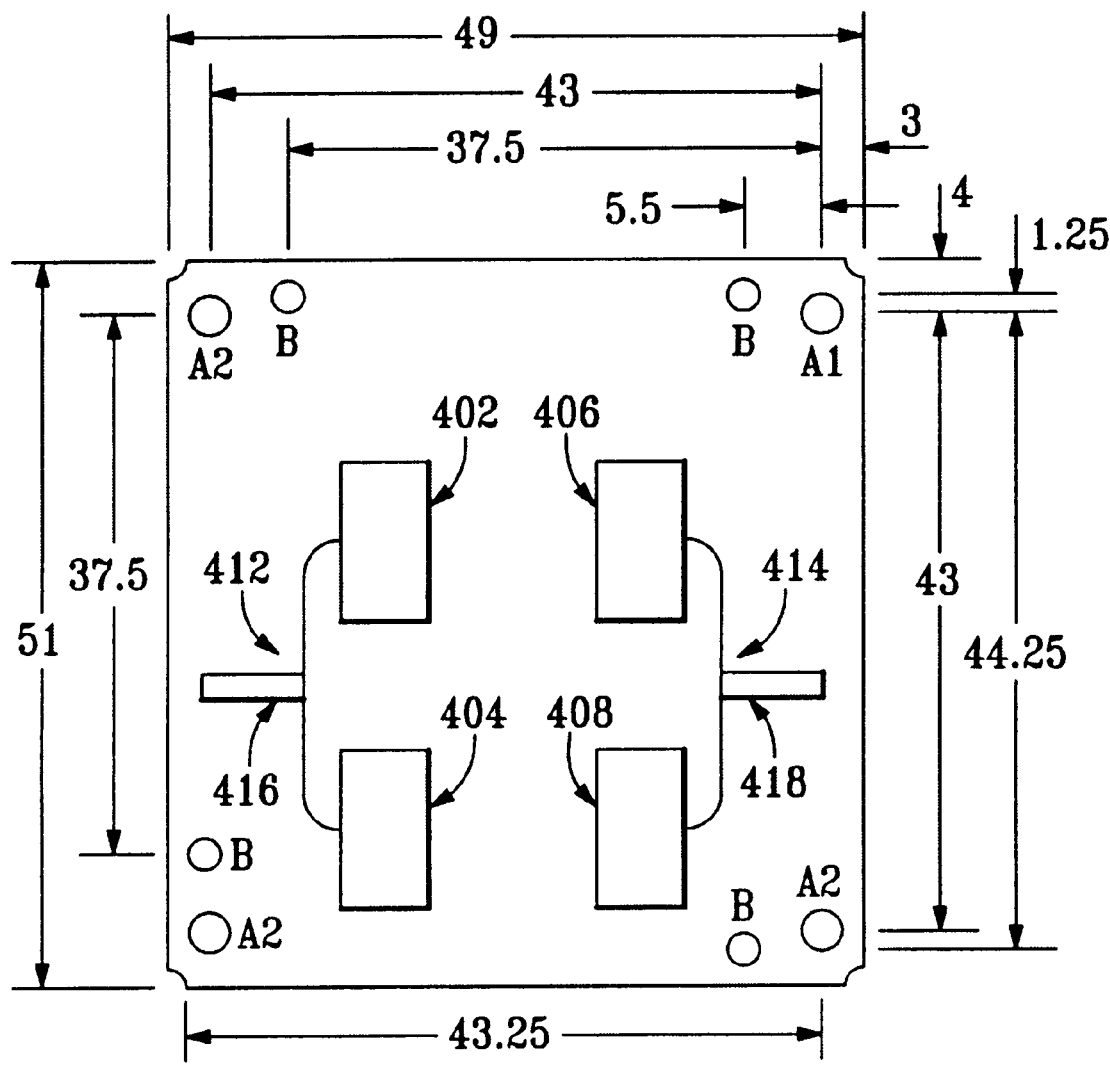
FIG. 4 illustrates the antenna patches of a microwave detector.

FIG. 4 shows the antenna board 400 which can be of singe-sided construction and carries separate transmit and receive antenna arrays. The transmit antenna array 414 comprises two microstrip patch elements, 406 and 408, which are interconnected and connected to a common feed line 418. The receive antenna array 412 also comprises two microstrip patch elements, 402 and 404, which are interconnected and connected to a common feed line 416. Various 2.2 mm holes B are provided to aid the positioning of the antenna board 400 to or on a suitable housing (not shown). Four 3 mm holes A1 and A2 are provided to secure the antenna board 400 to or within the housing (not shown). All dimensions are shown in millimeters.

Figure 5:
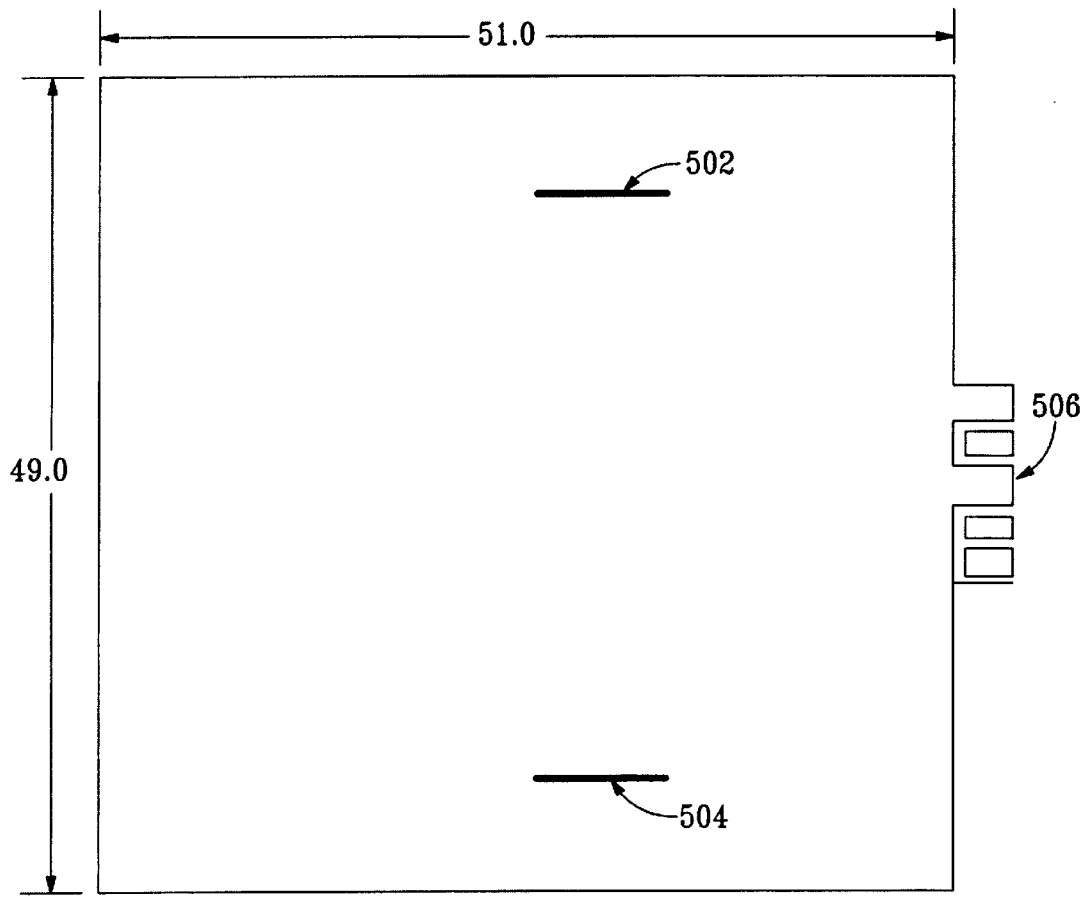
FIG. 5 shows a ground plane having two antenna coupling slots for the microwave detector as is also illustrated in PCT/GB91/02099.
Figure 6:
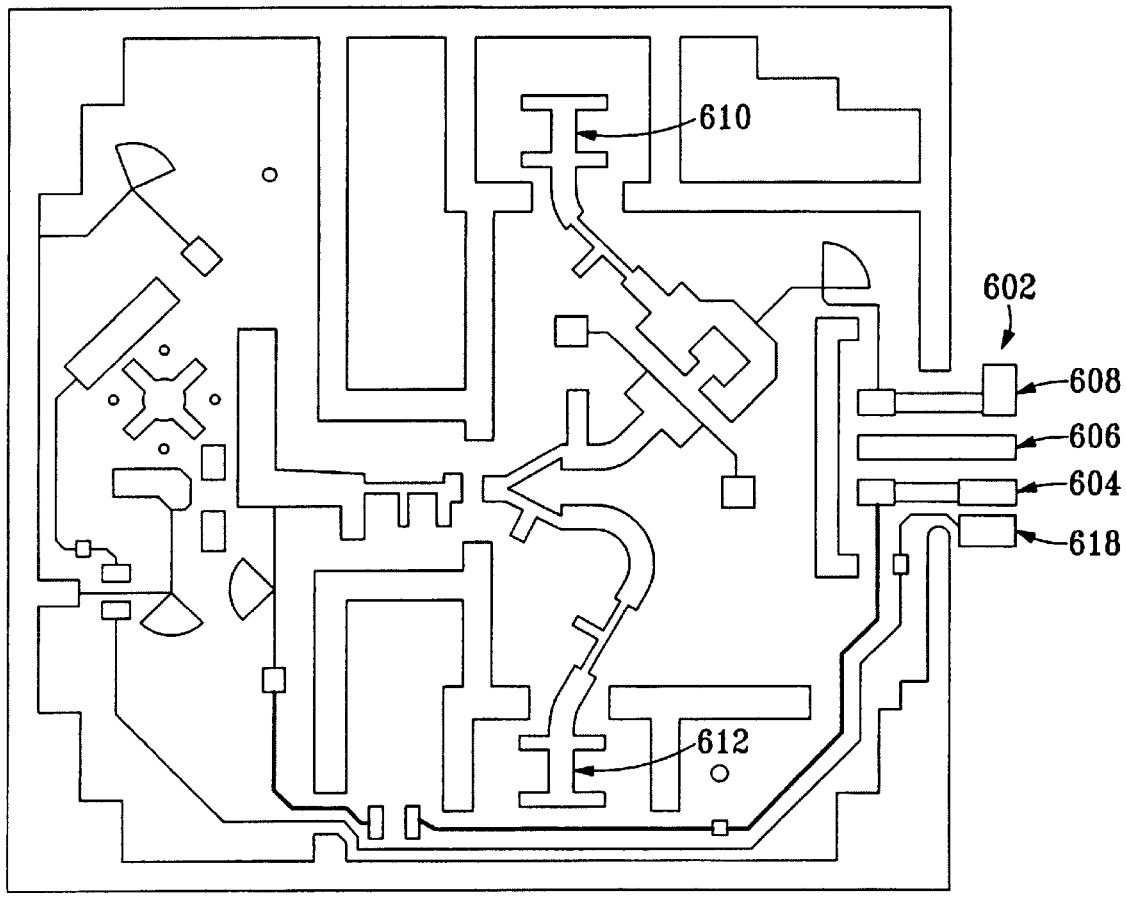
FIG. 6 depicts the microwave detector microstrip circuitry disposed on the opposite side of the board bearing the ground plane.
Figure 7:
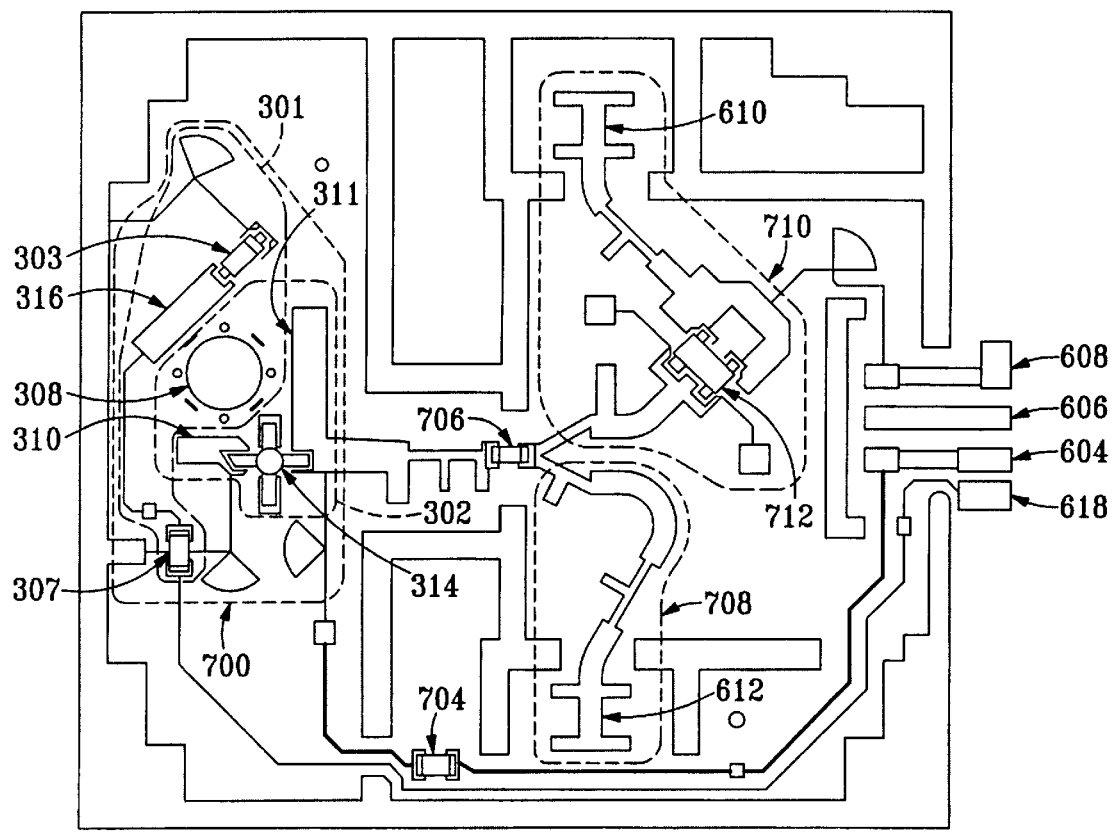
FIG. 7 illustrates the microwave detectors microstrip circuitry having the components disposed thereon.

FIGS. 5 and 6 show the groundplane 500 and the component side circuitry 600 respectively of the microwave circuit board. FIG. 7 shows the component side of the ;microwave circuit board 600 with the components mounted thereon. The oscillator circuit 700 is enclosed by the broken line. The oscillator circuit comprises a first 301 and second 302 electromagnetically couplable resonant circuits. The first resonant circuit comprises means for receiving a modulating voltage v(t) including a connection tab 618, a 1 KOhm resistor 307, a forward biased Schottky diode 303 and a tuning line 316 electromagnetically couplable to the dielectric resonator 308.

The second circuit 302 comprises the dielectric resonator 308 coupled, via microstrip lines 310 and 311 to the gate and drain of a FHX35LPT transistor 314. Power is provided to the transistor 314 via a 39 Ohm resistor 704.

The output from the oscillator circuit 700 is fed via a decoupling capacitor 706 to the transmit 708 and receive 710 portions of the detector. The transmit portion 708 comprises a microstrip line 612 for coupling to the transmit antenna. Similarly, the receive portion 710 receives via microstrip line 610 a reflected version of the transmitted signal. The microwave circuit board 600 and the antenna board 400 are mounted back-to-back with the groundplane intervening. The alignment of the boards is such that the transmit array feed line 418 overlies the associated feed line 612 on the microwave circuit board. Similarly, the receive array feed line 416 on the antenna board overlies the associated feed line 610 on the microwave circuit board. Coupling between the microwave circuit board and the antenna board is achieved by the provision of two narrow slots 502 and 504 in the groundplane layer of the microwave board. The received reflected signal and a portion of the output from the oscillator circuit are combined using a mixer diode 712, for example, a BAT15-099, to produce an IF signal which is output via connection tab 608.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiments. The invention extends to any novel one, or any novel combination, of the features disclosed in this specification (including any accompanying claims, abstract and drawings), or to any novel one, or any novel combination, of the steps of any method or process so disclosed.

We claim:

1. An oscillator circuit (300) comprising first (301) and second (302) mutually electromagnetically couplable resonant circuits, the second circuit (302) comprising a dielectric element (308) and excitation means (310, 314, 311) operable to produce a first frequency of oscillation, the first circuit (301) comprising the dielectric element (308), excitation means (316, 303, 307) including a two-terminal Schottky device (303) operable, responsive to an applied signal (322), to vary the resonant frequency of the first resonant circuit (301), and thereby vary the frequency of oscillation of the oscillator circuit (300).

2. A circuit as claimed in claim 1, wherein the two terminal device Schottky device (303) is operable in forward bias mode.

3. A circuit as claimed in claim 2, wherein said Schottky device is a Schottky diode (303).

4. A circuit as claimed in claim 1, 2, or 3, wherein the modes of resonance have associated coupling points on the excitation means (310, 311), and the excitation means (310, 311) is arranged such that the coupling points are a substantially equal distance from the dielectric element 308.

5. A circuit as claimed in claim 4, wherein the dielectric element 308 comprises an arcuate profile and said excitation means is arranged to follow substantially the arcuate profile of the dielectric element 308.

6. A circuit as claimed in claim 1, 2, or 3, wherein said excitation means (310, 311, 316) comprises excitation microstrip lines.

7. A motion detection device comprising an oscillator circuit as claimed in claim 1, 2, or 3.

8. A microwave transmit/receive assembly comprising an oscillator as claimed in claim 1, 2, or 3.

* * * * *

UNITED STATES PATENT AND TRADEMARK OFFICE
CERTIFICATE OF CORRECTION

PATENT NO. : 6,064,276
DATED : May 16, 2000
INVENTOR(S) : John G. Hallatt, et al.

It is certified that error appears in the above-indentified patent and that said Letters Patent is hereby corrected as shown below:

On the title page,

[73] Assignee, should read:

--Microwave Solutions Limited, Herts, United Kingdom--.

--Attorney, Agent, or firm should read - Sheldon & Mak--.

Signed and Sealed this

Tenth Day of April, 2001

*Attest:*

NICHOLAS P. GODICI

*Attesting Officer*  *Acting Director of the United States Patent and Trademark Office*